United States Patent
Scheidig

[11] Patent Number: 6,124,812
[45] Date of Patent: Sep. 26, 2000

[54] METHOD AND ARRANGEMENT FOR REDUCING THE LINEARITY INFLUENCES IN HIGH-FREQUENCY CIRCUITS, PARTICULARLY IN A/D CONVERTERS

[75] Inventor: Hardy Scheidig, Neufinsing, Germany

[73] Assignee: Rhode & Schwarz GmbH & Co. KG, Munich, Germany

[21] Appl. No.: 09/225,685

[22] Filed: Jan. 6, 1999

[30] Foreign Application Priority Data

Jan. 12, 1998 [DE] Germany .......... 198 00 775

[51] Int. Cl.[7] .................................. H03M 1/06
[52] U.S. Cl. ........................................ 341/118
[58] Field of Search .......................... 341/118, 155, 341/119, 120, 121

[56] References Cited

U.S. PATENT DOCUMENTS 4,654,712  3/1987  Gershfeld .................. 358/184

OTHER PUBLICATIONS

Hewlett Packard Journal December 1993, vol. 44, No.6.

*Primary Examiner*—Brian Young
*Attorney, Agent, or Firm*—Hill & Simpson

[57] ABSTRACT

To reduce linearity error influences in a HF circuit, particularly in an A/D converter, an input signal of the circuit is multiplied by a first auxiliary signal, and an output signal of the circuit is multiplied by a second auxiliary signal, the first and second auxiliary signals being selected such that a harmonic spectrum of the circuit is broadened.

8 Claims, 1 Drawing Sheet

METHOD AND ARRANGEMENT FOR REDUCING THE LINEARITY INFLUENCES IN HIGH-FREQUENCY CIRCUITS, PARTICULARLY IN A/D CONVERTERS

BACKGROUND OF THE INVENTION

The invention relates to a method and an arrangement for reducing the linearity error influences in HF circuits, particularly in A/D converters.

Linearity errors of the transmitting function of electronic circuits, of the preselection of a receiver or of an A/D converter, for example, often sharply limit the possibilities to use such circuits for measuring purposes. The non-linearities of such circuits act mainly by means of harmonic waves. Spectrally seen secondary lines (what are known as spurious lines) arise. In an A/D converter, such spurious lines lead to a falsification of the signal to be digitized.

To reduce the linearity errors of A/D converters, what is known as dithering is taught (Large-Scale Dithered ADC, Hewlett Packard Journal, December 1993). An artificially generated auxiliary signal is therein added to the useful signal at the input of the A/D converter, said signal being separated from the useful signal again at the output. In this known method, whose effectiveness depends on the conditions of use and is difficult to assess, particularly for integral non-linearities, the effective control range of the A/D converter is reduced and the useful bandwidth is restricted.

SUMMARY OF THE INVENTION

It is thus an object of the invention to demonstrate a method which avoids these disadvantages and which enables a better suppression of the effects of linearity errors of such electronic circuits as A/D converters. A simple arrangement for carrying out the method is also provided.

According to the method of the invention for reducing linearity air influences in an HF circuit, an input signal of the circuit is multiplied by a first auxiliary signal, and an output signal of the circuit is multiplied by a second auxiliary signal, the first and second auxiliary signals being selected such that a harmonic wave spectrum of the circuit is broadened.

The method of the invention permits a very effective and strong suppression of the harmonic waves generated by such non-linearities of electronic circuits. It is suitable for arbitrary electronic circuits wherein corresponding harmonic waves arise due to the non-linearities of the transfer function of the circuit. The method of the invention is particularly suitable for an A/D converter, however. Contrary to the known addition according to the dithering method, the multiplication by two auxiliary signals at the input and output does not restrict the useful bandwidth or the effective control range of an AND converter.

The invention is detailed below in exemplifying embodiments, in the example of an A/D converter, specifically, with the aid of schematic drawings.

DESCRIPTION OF THE PREFERRED EMBODIMENTS

Figure 1:
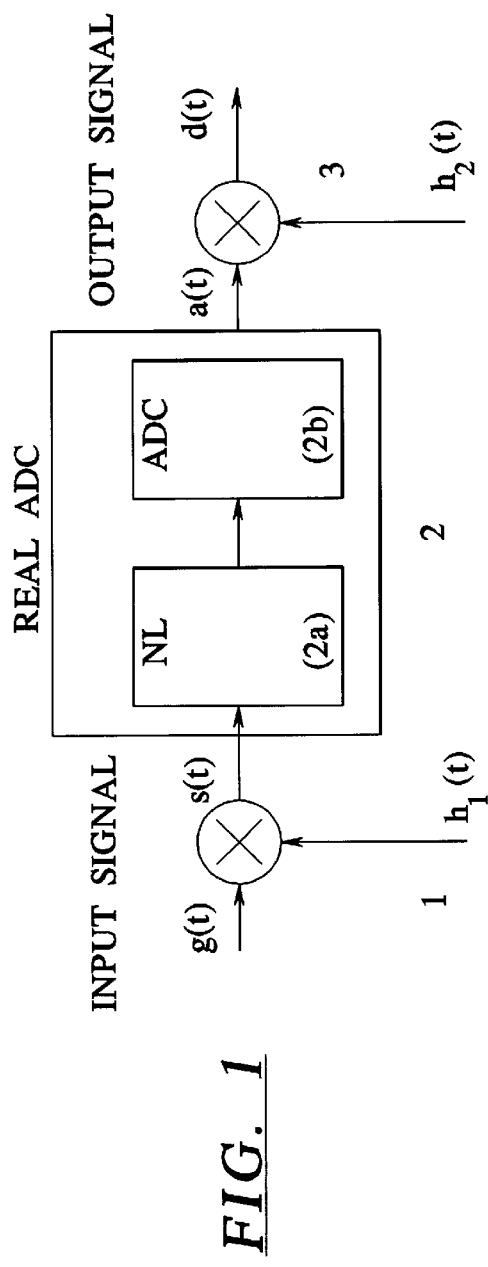
FIG. 1 is a schematic block diagram illustrating a general construction of the circuit for carrying out the invention wherein linearity error influences are reduced in an HF circuit.

FIG. 1 depicts the general construction for carrying out the method. The analog input signal $g(t)$ is fed to a multiplier 1, which, by multiplying by an auxiliary signal $h_1(t)$, generates a signal $s(t)$ with the following form:

$$s(t) = g(t) \cdot h_1(t).$$

This signal is fed to the real A/D converter 2, which, according to the model, is composed of an arbitrary non-linearity 2a and an ideal A/D converter 2b. The non-linearity can be represented by a polynomial of nth order with the coefficients $k_n$. At the output of the AD converter 2, i.e. after passage through the non-linearity 2a and of the ideal A/D converter 2b, the scanned signal $a(t)$ is present in the form $$a(t) = A\left\{\sum_n k_n \cdot s(t)^n\right\}$$

$$= A\left\{\sum_n k_n \cdot g(t)^n \cdot h_1(t)^n\right\}$$

$$= A\left\{\sum_{m=2}^{\infty} k_m \cdot g(t)^m \cdot h_1(t)^m\right\} + A\{k_1 \cdot g(t) \cdot h_1(t)\}$$

"$A\{\ \}$" references the general scanning process of the ideal A/D converter.

$$A\{u(t)\} = u(t) \cdot t_0 \cdot \sum_{z=-\infty}^{\infty} \delta(t - z \cdot t_0)$$

with $t_0 = 1/f_a$ fa—scanning frequency of the A/D converter

After the A/D converter 2, another multiplication by an auxiliary signal $h_2(t)$ occurs by means of the multiplier 3.

$$d(t) = a(t) \cdot h_2(t)$$

$$= A\left\{\sum_{m=2}^{\infty} k_m \cdot g(t)^m \cdot h_1(t)^m \cdot h_2(t)\right\} + A\{k_1 \cdot g(t) \cdot h_1(t) \cdot h_2(t)\}$$

This other multiplication has the object of compensating the effects of the multiplication of the auxiliary signal $h_1(t)$ carried out before the converter such that the now digitized useful signal $A\{g(t)\}$ is extractable, and at the same time a spectral broadening of the harmonic waves takes place.

The digitized useful signal is extractable specifically if the nature of the auxiliary signal is such that the term $$A\{k_1 \cdot g(t) \cdot h_1(t) \cdot h_2(t)\}$$

can be split into two linearly independent terms $$A\{k_1 \cdot g(t)\} \text{ and } A\{x(t) \cdot g(t)\}.$$

For $h_1(t)$ and $h_2(t)$, the relationship $$A\{k_1 \cdot g(t) \cdot h_1(t) \cdot h_2(t)\} = A\{k_1 \cdot g(t)\} + A\{x(t) \cdot g(t)\}$$

ultimately results in the ratio, $$h_2(t) = \frac{1 + x(t)}{h_1(t)}$$

x(t) is an arbitrary term which fulfils the condition $$\int_{-\infty}^{\infty} x(t) \cdot g(t) \cdot g^*(t+\tau) \cdot dt = 0$$

Given the appropriate selection of the auxiliary signals $h_1(t)$ and $h_2(t)$, the spectral broadening of the harmonic waves occurs by the factor of $$h_1(t)^m \cdot h_2(t),$$

which arises in the harmonic wave term.

This means that the energy of the harmonic waves is divided into a broad spectral range, particularly given narrow-band input signals g(t). As a result, the spectral maxima fall off corresponding to the spectral broadening and potentially become invisible in the noise floor.

In comparison, without the method of the invention, i.e. given the input signal's passage through the real A/D converter 2, exclusively, an input signal d*(t) in the form of $$d^*(t) = A \left\{ \sum_{m=2}^{\infty} k_m \cdot (g(t))^m \right\} + A\{k_1 \cdot g(t)\}$$

would arise, which, contrary to the method of the invention, does not contain an additional factor in the harmonic wave term.

A theoretically possible, simple auxiliary signal constellation results from $$h_1(t) = e^{j \cdot 2 \cdot \pi \cdot \int f(t) \cdot dt} \text{ and } h_2(t) = e^{-j \cdot 2 \cdot \pi \cdot \int f(t) \cdot dt}$$

with $$f(t) = f_0 + c_1 \cdot t.$$

These auxiliary signals represent a linear frequency sweep with the carrier frequency $f_0$ and with a rise factor $c_f$. This results in the following:

$$s(t) = g(t) \cdot e^{j \cdot 2 \cdot \pi \cdot \int f(t) \cdot dt}$$

$$a(t) = A \left\{ \sum_n k_n \cdot s(t)^n \right\} = A \left\{ \sum_n k_n \cdot g(t)^n \cdot e^{j \cdot 2 \cdot \pi \cdot n \cdot \int f(t) \cdot dt} \right\}$$

$$= A \left\{ \sum_{m=2}^{\infty} k_m \cdot g(t)^m \cdot e^{j \cdot 2 \cdot \pi \cdot m \cdot \int f(t) \cdot dt} \right\} + A\{k_1 \cdot g(t) \cdot e^{j \cdot 2 \cdot \pi \cdot \int f(t) \cdot dt}\}$$

$$d(t) = a(t) \cdot e^{-j \cdot 2 \cdot \pi \cdot \int f(t) \cdot dt}$$

$$= A \left\{ \sum_{m=2}^{\infty} k_m \cdot g(t)^m \cdot e^{j \cdot 2 \cdot \pi \cdot m \cdot \int f(t) \cdot dt} \cdot e^{-j \cdot 2 \cdot \pi \cdot \int f(t) \cdot dt} \right\} +$$

$$A\{k_1 \cdot g(t) \cdot e^{j \cdot 2 \cdot \pi \cdot \int f(t) \cdot dt} \cdot e^{-j \cdot 2 \cdot \pi \cdot \int f(t) \cdot dt}\}$$

$$= A \left\{ \sum_{m=2}^{\infty} k_m \cdot g(t)^m \cdot e^{j \cdot 2 \cdot \pi \cdot (m-1) \cdot \int f(t) \cdot dt} \right\} + A\{k_1 \cdot g(t)\}$$

For these auxiliary signals, the residual term r(t) even becomes identical to zero, so that a specific extraction is not necessary.

For the function f(t) as defined above, the factor $$e^{j \cdot 2 \cdot \pi \cdot (m-1) \cdot \int f(t) \cdot dt}$$

in the harmonic term represents a frequency sweep which depends on the order of the harmonic waves. This frequency sweep leads to a defined spectral broadening of the harmonic wave portions by $$\frac{(m-1) \cdot c_f \cdot t}{2}$$

Advantageous realization

Figure 2:
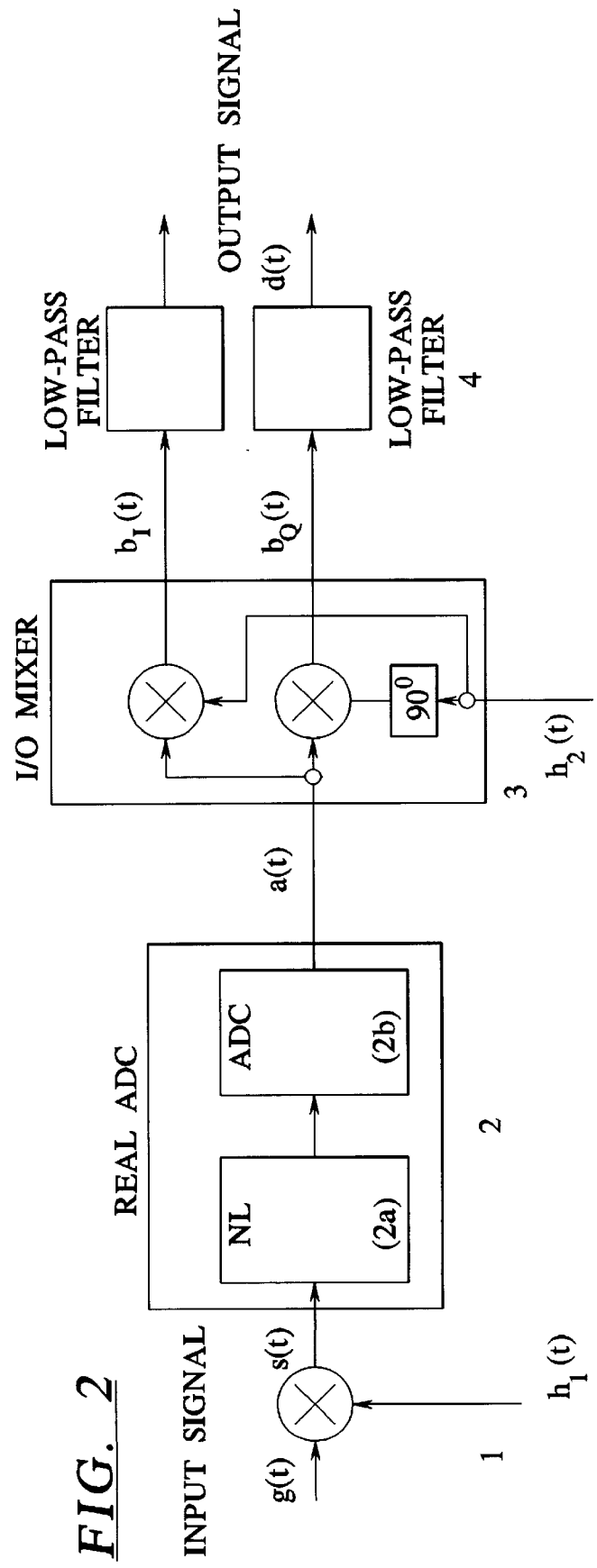
FIG. 2 is a schematic block diagram of a practical realization of the method of the invention in a spectrum analyzer.

FIG. 2 depicts the block wiring diagram of an arrangement for advantageous, practical realization of the method for application in a spectrum analyzer, for example. The analog signal g(t) is fed to a multiplier 1, which, by multiplication by an auxiliary signal $h_1(t)$, generates a signal s(t) with the form $$s(t) = g(t) \cdot h_1(t).$$

An analog mixer is utilized as multiplier 1. As auxiliary signal $h_1(t)$, the real signal with the form $$h_1(t) = \cos(2 \cdot \pi \cdot \int (f_0 + c_f t) \cdot dt)$$

is used. $h_1(t)$ is thus a signal which is linearly rising in frequency and which has the carrier frequency $f_0$, as can be generated by a typical synthesizer present in spectrum analyzers. The rise of the frequency can be varied by means of the constant $c_f$.

The resultant signal s(t) is fed to the A/D converter 2, so that the signal a(t) with the form $$a(t) = A \left\{ \sum_{m=2}^{\infty} k_m \cdot g(t)^m \cdot \cos\left(2 \cdot \pi \cdot \int (f_0 + c_f \cdot t) \cdot dt\right)^m \right\} +$$

$$A\left\{k_1 \cdot g(t) \cdot \cos\left(2 \cdot \pi \cdot \int (f_0 + c_f \cdot t) \cdot dt\right)\right\}$$

results.

The now digitized signal is fed to a conventional digital I/Q mixer and mixed with the auxiliary signal $h_2(t)$. Such I/Q mixers can be realized by means of software on a digital processor (e.g. on a digital signal processor), or by means of hardware in a specific circuit. They enable the multiplication by a complex signal via the relation $$e^{-j \cdot x} = \cos(x) - j \cdot \sin(x)$$

The auxiliary signal $h_2(t)$ is therein described by $$h_2(t) = \cos(2 \cdot \pi \int (f_0 + c_f t) \cdot dt)$$

The signal b(t), which can be interpreted as a complex signal and which is composed of the real portion bi(t) and the imaginary portion $b_q(t)$, arises in this way. The following applies:

$$b_I(t) = A \left\{ \sum_{m=2}^{\infty} k_m \cdot g(t)^m \cdot \cos\left(2 \cdot \pi \cdot \int (f_0 + c_f \cdot t) \cdot dt\right)^{m+1} \right\} +$$

$$A\left\{k_1 \cdot g(t) \cdot \cos\left(2 \cdot \pi \cdot \int (f_0 + c_f \cdot t) \cdot dt\right)^2\right\}$$

-continued $$b_Q(t) = A\left\{\sum_{m=2}^{\infty} k_m \cdot g(t)^m \cdot \cos\left(2 \cdot \pi \cdot \int (f_0 + c_f \cdot t) \cdot dt\right)^m \cdot \right.$$

$$(-)\sin\left(2 \cdot \pi \cdot \int (f_0 + c_f \cdot t) \cdot dt\right)\right\} -$$

$$A\left\{k_1 \cdot g(t) \cdot \cos\left(2 \cdot \pi \cdot \int (f_0 + c_f \cdot t) \cdot dt\right) \cdot \sin\left(2 \cdot \pi \cdot \int (f_0 + c_f \cdot t) \cdot dt\right)\right\}$$

$$b(t) = b_I(t) + j \cdot b_Q(t)$$

$$= b_I(t)$$

$$= A\left\{\sum_{m=2}^{\infty} k_m \cdot g(t)^m \cdot \cos\left(2 \cdot \pi \cdot \int (f_0 + c_f \cdot t) \cdot dt\right)^m \cdot e^{-j \cdot 2 \cdot \pi \cdot \int (f_0 + c_f \cdot t) \cdot dt}\right\} +$$

$$A\left\{\frac{1}{2} \cdot k_1 \cdot g(t)\right\} + A\left\{\frac{1}{2} \cdot k_1 \cdot g(t) \cdot e^{-j \cdot 4 \cdot \pi \cdot \int (f_0 + c_f \cdot t) \cdot dt}\right\}$$

In the subsequent filtering stage 4, the intensely energy-rich noise portion is separated out by the large factor $k_1$. This can be done easily with conventional digital filters, given appropriate selection of the carrier frequency $f_0$ of the two auxiliary signals $h_1(t)$ and $h_2(t)$. Besides the digitized useful signal, the resultant output signal d(t) consequently still contains the spectrally broadened harmonic waves.

The method functions not only in A/D converters, but also in all non-linear components and functional blocks which are connected between the multiplier 1 and the multiplier 2 as demonstrated.

Although various minor modifications might be suggested by those skilled in the art, it should be understood that my wish to embody within the scope of the patent warranted hereon all such modifications as reasonably and properly come with the scope of my contribution to the art.

What is claimed is:

1. A method for reducing linearity error influences in an HF circuit, comprising the steps of:

multiplying an input signal of the circuit by a first auxiliary signal, and multiplying an output signal of the circuit by a second auxiliary signal, said first and second auxiliary signals being selected such that a harmonic wave spectrum of the circuit is broadened.

2. The method for reducing linearity error influences in an HF circuit according to claim 1, including the steps of providing a multiplier at the input and output of the circuit, multiplying the input signal by the first auxiliary signal with the multiplier at the input side, and multiplying the output signal of the circuit by the second auxiliary signal with the multiplier at the output side.

3. The method according to claim 2 including the step of selecting the first and second auxiliary signals such that a digitized useful signal is divided into two linearly independent terms.

4. The method according to claim 2 wherein the first and second auxiliary signals are linearly rising in frequency, and the second auxiliary signal is inverse to the first auxiliary signal.

5. The method according to claim 2 wherein the HF circuit comprises an AD converter, and the first and second auxiliary signals are signals which respectively increase linearly with a frequency and which are of the form $\cos(2\cdot\pi\cdot\int(f_0 + c_f t)\cdot dt)$ with $f_0$ being a carrier frequency and $c_f$ being a constant specifying a rise of the frequency, and the multiplier provided at the output of the A/D converter is a complex mixer.

6. The method according to claim 1 including the step of generating the two auxiliary signals by a common frequency synthesizer.

7. The method according to claim 1, wherein the HF circuit comprises an A/D converter of a spectrum analyzer, and the first and second auxiliary signals are generated by an existing frequency synthesizer of the spectrum analyzer.

8. The method according to claim 1 wherein the HF circuit comprises an A/D converter.

* * * * *